United States Patent [19]

Lau et al.

[11] Patent Number: 5,146,159
[45] Date of Patent: Sep. 8, 1992

[54] PIN DRIVER FOR IN-CIRCUIT TEST APPARATUS

[75] Inventors: Jack Lau, San Francisco; Armagan A. Akar, San Jose; Hung-Wah A. Lau, Los Altos, all of Calif.

[73] Assignee: Schlumberger Technologies, Inc., San Jose, Calif.

[21] Appl. No.: 649,081

[22] Filed: Feb. 1, 1991

[51] Int. Cl.$^5$ .................... G01R 31/28; H03F 3/26
[52] U.S. Cl. ................... 324/158 R; 324/73.1; 330/263
[58] Field of Search ............ 324/158 R, 158 T; 307/260; 371/22.1, 27; 330/263, 306

[56] References Cited

U.S. PATENT DOCUMENTS

| | | | |
|---|---|---|---|
| 3,976,940 | 8/1976 | Chau et al. | 324/73.1 |
| 4,176,323 | 11/1979 | Odell | 330/263 |
| 4,490,673 | 12/1984 | Blum et al. | 324/158 R |
| 4,572,971 | 2/1986 | Necoechea | 307/260 |
| 4,743,841 | 5/1988 | Takeuchi | 324/158 T |
| 4,818,893 | 4/1989 | Domnitz | 330/263 |
| 4,864,249 | 9/1989 | Reiffin | 330/263 |
| 4,866,398 | 9/1989 | Gulczynski | 330/263 |

Primary Examiner—Ernest F. Karlsen
Attorney, Agent, or Firm—Steven P. Koda

[57] ABSTRACT

A tri-state pin driver is formed in part, along with a pin sensor, on an integrated circuit. A pin driver and sensor are coupled to a common pin of a device under test. In normal mode, the pin driver drives a test signal. In high impedance mode, the pin driver is at a high impedance, enabling a sensor to monitor a response signal. The pin driver includes a driver stage formed off-chip by a pair of power transistors operated in the active region. The large power transistors enable a large current (i.e., $+/-500$ mA) to be sourced or sunk so as to drive a device under test and back-drive preceding circuits. Operating in the active region enables faster logic state transition times, and thus, a fast test rate, while reducing undesirable signal distortion. A predriver stage is configured as a unity-gain emitter follower. The predriver stage includes first and second signal paths. Each signal path includes a pair of transistors configured, during normal mode, as a transmission gate. When the pin driver output is high impedance, the transistor pairs instead form open circuits in which respective collector-emitter junctions provide breakdown voltage protection. The pin driver also includes a waveform generator which receives a test state signal for defining the pin driver output logic level, and an analog slew rate control signal for defining the pin driver slew rate. Off-chip diodes are used to set the output levels of the waveform generator and to provide reverse breakdown voltage protection at the high reference voltage and low reference voltage terminals.

15 Claims, 5 Drawing Sheets

FIG. 1

| | SLB 700 | AD 1323 | Zentec 8000 | HP 3070 | GenRad 2282 | Tera L210i D4 |
|---|---|---|---|---|---|---|
| DRIVE RANGE (V) | -6 TO +6 | -12 TO +12 | -3.5 TO +7 | -3.5 TO +5 | -6 TO +10 | -15 TO +15 |
| SENSE RANGE (V) | -6 TO +6 | | -5 TO +10 | -3.5 TO +5 | -6 TO +10 | -15 TO +15 |
| PATTERN RATE (MHz) | 10 | 50 | 10 | 12.5 | | 10 |
| SLEW RATE (V/μs) | 60 | 50-500 | 200 | 25-250 | 60 | |
| SOURCE CURRENT (mA) | 500 | 500 | 400 | 700 | 500 | 500 |
| SINK CURRENT (mA) | 300 | | 400 | 500 | 500 | |
| SENSE CURRENT (Vmax) | 15μA | | | | | |
| SENSE CURRENT (V=0) | +/- 1μA | | | | | |
| ACCURACY SENSE | +/- 10mV | | | | 100 mV | +/- 50mV |
| MIN PULSE DETECT | 20ns | | >> 10ns | 30ns | | 50ns |
| MIN PULSE GAP | 50ns | | | 50ns | | |
| MIN PULSE GENERATE | 10 ns | | | | | |
| PROGRAM BACKDRIVE | | | 100μs-410s | | | |
| PROGRAM DUTY CYCLE | | | 5%-95% | | | |
| TRANSITION 50pf LOAD | | | | | 24ns (ECL) | |
| Z OUTPUT | 2 ohms | | | | 2 ohms | |
| R PULL-UP | 3.4 kohms | | | | 3.3 kohms | |
| R PULL-DOWN | 3.4 kohms | | | | 2.2 kohms | |
| ECL TERM | 100 ohms | | | | | |

PIN DRIVER FOR IN-CIRCUIT TEST APPARATUS

BACKGROUND OF THE INVENTION

This invention relates to in-circuit test systems and more particularly to an integrated pin driver for an in-circuit test system.

Test systems for integrated circuits are classified in the industry as either "functional" or "in-circuit" test systems. A functional test system treats an entire pc board as a single test element, while an in-circuit test system treats a single component as the test element. For a functional test system, a test pattern is applied to the pc board inputs, while the pc board outputs are monitored and analyzed. To isolate a particular component with a functional test system, an appropriate test pattern must be generated so as to exercise the component. As the component may be at a location remote from the pc board input connection and may be coupled to many other components, it is difficult to engineer such test patterns for complex designs. Accordingly, functional test systems often are ineffective at isolating a component on a pc board under test.

An in-circuit test system treats a single component as the test element (e.g., device under test). A test pattern is applied directly to the component through pin drivers, while the responses are monitored through sensors. Accordingly, the test pattern directly exercises the component under test. As a result, an in-circuit test system provides a more effective testing methodology.

As the device under test (DUT) for an in-circuit test system is an IC component electrically coupled to other IC components, the DUT receives one or more inputs signals from preceding circuits and sends one or more output signals to subsequent circuits. In order to apply a test pattern to the DUT inputs, the input signals from the preceding circuits need to be overridden. Such overriding is referred to as "backdriving" the preceding circuits. As used herein, backdriving refers to sinking or sourcing sufficient current so that the DUT input is driven to the desired logic state, regardless of whether the preceding circuit output(s) are at the same or a different logic state. To drive the DUT so as to override the input signal from the preceding circuit, the pin driver applies a common high current signal to the DUT input and the preceding circuit output. Accordingly, the test system drives the DUT, while backdriving the preceding circuit(s).

Figure 1:
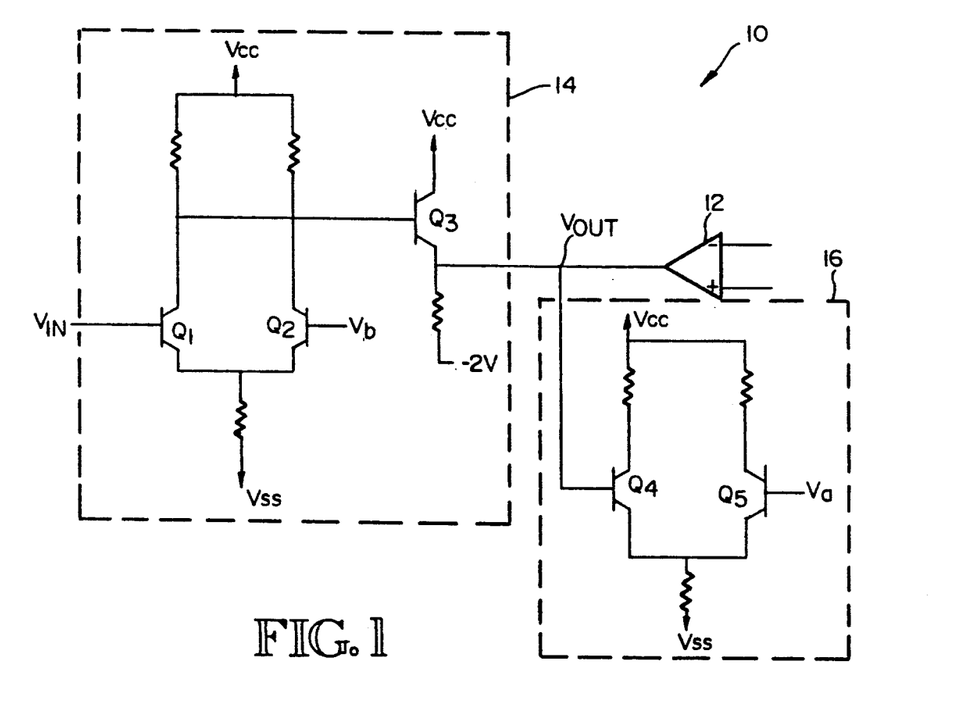
FIG. 1 is a schematic of a prior art pin driver and a pair of conventional inverters.

FIG. 1 depicts a prior art circuit 10 including a driver 12, a first inverter 14 (e.g., preceding circuit) and a second inverter 16 (e.g., DUT). Under normal operations, the first inverter 14 drives the second inverter. When the input to the first inverter 14 is a logic high, the output to the first inverter 14 is a logic low. Thus, the input to the second inverter 16 is a logic low. If according to a test operation, the input to the second inverter 16 is desired to be a logic high while the output to the first inverter 14 is a logic low, then the low output of the first inverter must be overridden to provide a logic high input to the second inverter 16. The driver 12 thus needs to backdrive the first inverter 14 by sourcing sufficient current to raise the second inverter 16 input to a logic high.

In another case, the input to the first inverter 14 may be a logic low, causing its output to be a logic high. Thus, under normal operation, the input to the second inverter 16 is a logic high. If according to a test operation, the input to the second inverter 16 is desired to be a logic low, then the high output of the first inverter 14 must be overridden to provide a logic low input. The driver 12 thus backdrives the first inverter 14 by sinking current from the first inverter 14 so as to drive the second inverter 16 input low. Accordingly, the driver must sink or source current to control the DUT and backdrive preceding circuits.

Large backdriving currents induce large power dissipation, and thus, increased temperature. Prolonged temperature changes may damage the device under test and preceding circuits. Extreme temperature rise may cause melting of metal or semiconductor or alloys, while moderate temperature rise may shorten circuit lifetime due to thermally induced mechanical stresses. Accordingly, backdriving currents of short duration are desireable. A high test pattern rate, and thus short duration of backdriving current, has been found to avoid damaging the device under test and preceding circuits.

Various devices to be tested may have logic gates of varying technology (i.e., ECL, CMOS, bipolar). Each technology requires prescribed voltage levels to register a given logic level. Such prescribed voltage levels typically vary from technology to technology. Accordingly, an in-circuit test system able to drive test signals of differing voltage levels is needed to achieve a versatile in-circuit test system.

To test many devices in a short time, a high data rate is desireable. One parameter which impacts the data rate is the slew rate of the test signal. A fast slew rate enables the system to run at a high data rate so as to test more devices in less time. Adversely however, a fast slew rate causes more overshoot and ringing (e.g., transmission line effect). Because a test signal may travel a few feet along a cable before arriving at a DUT, such transmission line effect may become significant. Thus, the overshoot or ringing caused by a signal having a fast slew rate may result in voltage swings large enough to alter the logic level registered by a given device. Because the load impedance is not always much larger than the source impedance, a solution in which the source impedance is matched to the transmission line impedance may not be feasible. To minimize the transmission line effects at the test head, a series termination is conventionally used which dissipates the reflections. Such termination attenuates the test signal amplitude and correspondingly reduces the slew rate. Accordingly, a trade-off of the slew rate speed is desireable so as to enable a sufficiently high data rate, while also keeping the transmission line effects insignificant.

To test devices having differing input/output pin configurations, it is desirable to provide an integrated driver/sensor having a plurality of pin drivers and a plurality of sensors, each pin driver and sensor sharing a common DUT pin. Accordingly there is a need for a tri-state pin driver which has a high impedance output when a sensor is to monitor a common DUT pin. As a result, there also is a need for a pin driver which can withstand a large breakdown voltage during the high impedance mode.

Figure 2:
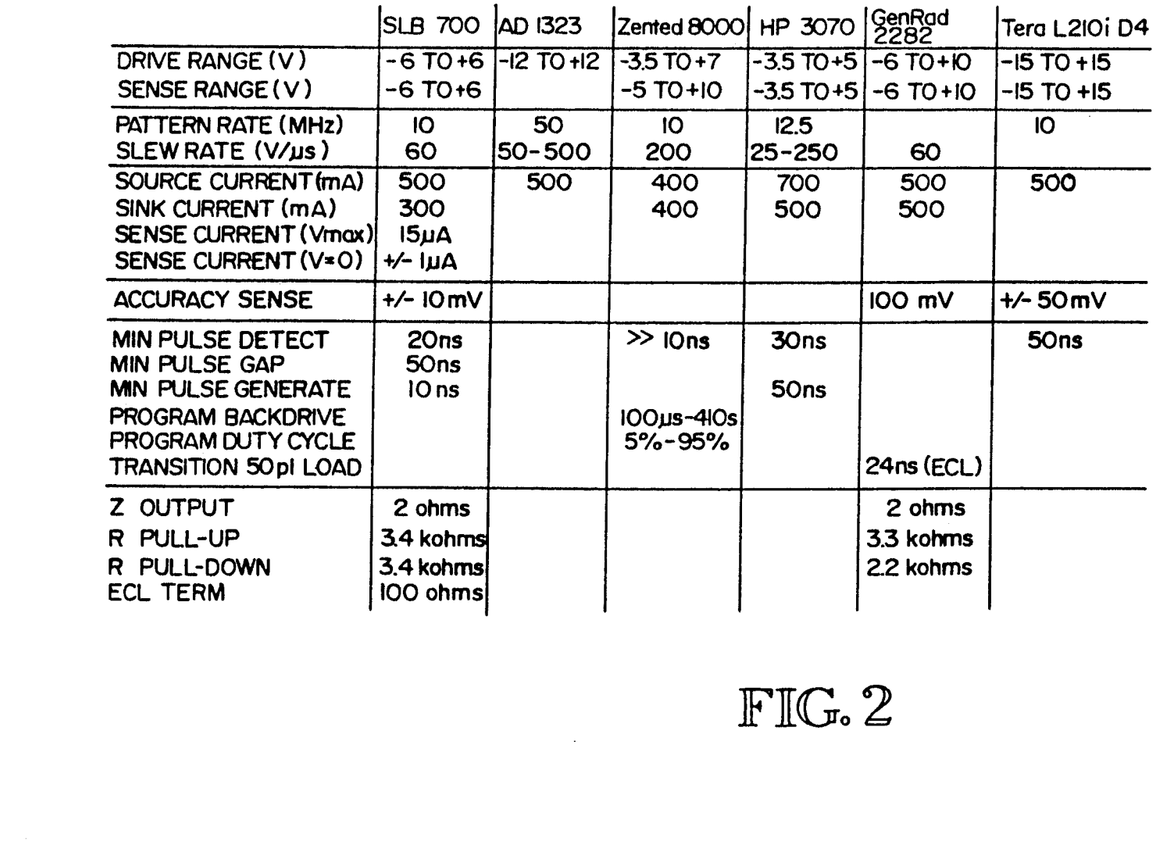
FIG. 2 is a table of performance characteristics for several prior art drivers.

FIG. 2 shows performance characteristics of conventional drivers. The listed drivers include: Schlumberger series 700 (SLB), Analog Devices 1323 (AD), Zentel 8000, Hewlett-Packard 3070 (HP), GenRad 2282, and Teradyne L210i D4 (Tera).

Conventional pin drivers include saturating current switches at the output stage. To switch between logic states at the output requires that the switch come out of saturation, then into saturation in the opposite logic state. As a result, the switching time is unnecessarily long.

SUMMARY OF THE INVENTION

According to the invention, a tri-state pin driver is provided which generates a logic high, logic low or high impedance output. In normal mode, the pin driver generates a dynamic test signal which switches between logic states according to a desired test pattern. In high impedance mode, the pin driver output is at a high impedance level so that the device under test (DUT) may be monitored by a sensor. A pin driver and sensor are embodied on a common IC with specific pin driver components being formed off-chip. A pin driver/sensor pair are coupled to a common DUT pin and may function to perform either of the following: drive a given DUT pin only, sense a given DUT pin only, or drive a given DUT pin while simultaneously sensing the same DUT pin.

According to one aspect of the invention, the pin driver includes a waveform generator and a unity-gain emitter-follower pre-driver stage amplifier coupled to an off-chip emitter-follower output stage. In normal mode the pin driver sources or sinks large output currents so as to drive a DUT pin and backdrive preceding circuits. To achieve the large currents, the driver output stage is formed off-chip by a pair of emitter-coupled power transistors (e.g., a pull-up power transistor and a pull-down power transistor).

According to another aspect of the invention, the power transistors forming the output stage operate in the active region enabling a faster switching time and thus faster test rate than for a pin driver having saturating drive transistors. The power transistors remain in the active region avoiding the switching delays of saturating transistors. In addition, less ringing occurs in the output signal as the output storage capacitance is reduced. As a result, the pin driver is more reliable and avoids inadvertent alteration of logic states at preceding circuits. Operating in the active region with rail voltage levels related to high and low reference voltage levels automatically configures the power transistors for different logic high output voltage levels and logic low output voltage levels. Accordingly, the pin driver can be adapted to drive DUTs of varying technology (and thus different logic voltage levels) by simply altering a logic high reference voltage and a logic low reference voltage.

According to a preferred embodiment, the waveform generator includes a pair of current sources controlled by a slew control signal. The current sources are switched alternatively by a test state signal. A high test state signal causes the waveform generator output to go to one diode drop above a high reference voltage level. A low test state signal causes the waveform generator output to go one diode drop below the low reference voltage level. The output switches at a slew rate controlled by the magnitude of the respective current sources and a nodal capacitance. The slew rate control signal varies the current sources to control the slew rate of the waveform generator.

The output of the waveform generator is buffered by a unity gain amplifier including two cascading emitter follower circuits. For class AB operation, the emitter followers are forward biased to maintain a low quiescent current through the off-chip output stage and to reduce cross-over harmonic distortions.

According to another aspect of the invention, the pin driver includes breakdown voltage paths capable of withstanding the typically large voltage swings between the high impedance pin driver output and internal voltage levels. A breakdown voltage path between a predriver stage input and the high impedance output is enhanced by a pair of protection transistors in each of two pre-driver signal paths. During normal mode, each respective pair of protection transistors functions as a transmission gate passing a respective predriver signal. During the high impedance mode, each respective pair of protection transistors provides an open circuit across the respective collector-emitter junctions of each protection transistor. The collector-emitter junction of each transistor can accommodate a large breakdown voltage in one direction, and only a small breakdown voltage in the other. Accordingly a pair of protection transistors are used in each of the two predriver signal paths. One is oriented for forward breakdown voltage protection, the other is oriented for reverse breakdown voltage protection.

DESCRIPTION OF THE PREFERRED EMBODIMENT

Overview

Figure 3:
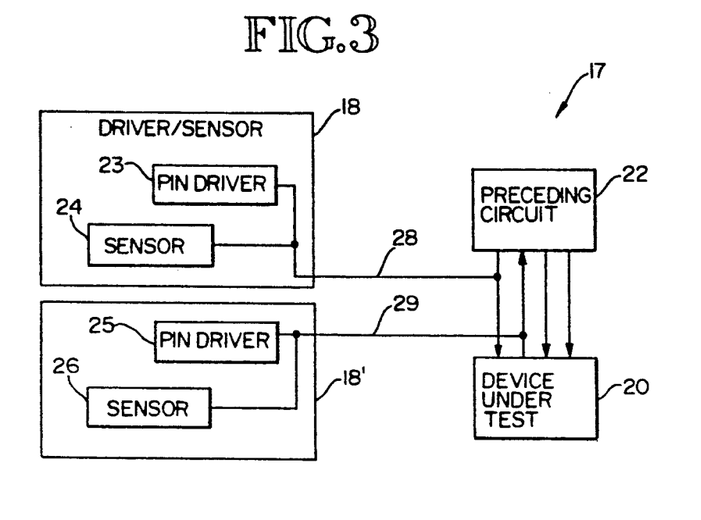
FIG. 3 is a block diagram of a test configuration according to an embodiment of this invention.

FIG. 3 depicts a test configuration 17, including driver/sensors 18, 18' a device under test (DUT) 20 and a preceding circuit 22. The DUT 20 is an integrated circuit component having a plurality of pins or leads. For in-circuit testing the DUT 20 typically is coupled to one or more preceding circuits 22. The driver/sensor 18 includes a pin driver 23 and a sensors 24 for driving a test signal (i.e., 28) or monitoring a response signal. Similarly, the driver/sensor 18' includes a pin driver 25 and a sensor 26 for driving a test signal or monitoring a response signal (i.e., 29).

The pin driver/sensor circuits 18, 18' function to drive a pin, sense a pin or both drive and sense a pin. When sensing a pin without driving a pin, the driver circuit 23 is in a high impedance mode. To test the DUT 20, a pin driver 23 generates a test pattern which is applied to the input pins of the DUT 20, while a sensor 26 monitors the output pins of the DUT 20 to detect the response to the test pattern. The driver/sensor 18, 18' is partly embodied as an IC with a pin driver and sensor electrically coupled to a common pin of the DUT 20. For a DUT pin which is an input pin, the pin driver 23, 25 generates a test signal. For a DUT pin which is an output pin, the driver 23, 25 is put into a high impedance state, enabling the sensor 24, 26 to monitor the DUT pin's output signal. As depicted in FIG. 1, pin driver 23 drives test signal 28 to an input pin of DUT 20, while pin driver 25 is in a high impedance state enabling sensor 26 to monitor response signal 29 generated at an output pin of DUT 20.

Pin driver 23 backdrives the preceding circuit 22 so that the desired logic state is applied to the input pin of DUT 20, regardless of the logic state of the output pin of preceding circuit 22.

Figure 4:
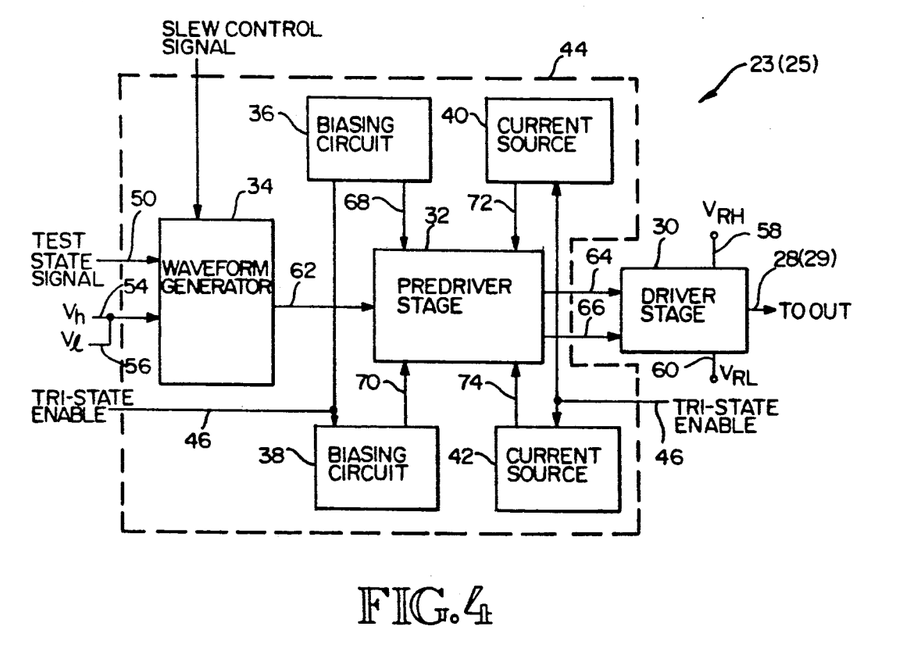
FIG. 4 is a block diagram of the driver of FIG. 3 according to an embodiment of this invention.

FIG. 4 is a block diagram of a pin driver 23 (25). The pin driver 23 includes a driver stage 30, a predriver stage 32, a waveform generator 34, biasing circuits 36, 38 and current sources 40, 42. The predriver stage 32, waveform generator 34, biasing circuits 36, 38 and current sources 40, 42 are formed on an integrated circuit 44 with corresponding circuits for other pin drivers 25, and with sensors 24, 26. Accordingly, the driver/sensor 18 is formed by an integrated circuit with several off-chip components including multiple driver stages 30 for the respective pin drivers 23, 25.

The pin driver 23 (25) receives a tri-state enable signal 46, a test state signal 50 and an analog slew rate control signal 52, along with high and low reference voltages 54, 56 and high and low rail voltages 58, 60. The tri-state enable signal 46 defines whether the pin driver is in normal mode or high impedance mode. The test state signal 50 determines the logic state of the test signal 28 at a given time. The slew rate control signal 52 determines the slew rate of the test signal 28 for switching between logic states. The high and low reference voltages 54, 56 define voltage levels for the respective test signal 28 logic states. The rail voltages 58, 60 determine the supply voltages to the driver stage 30 for driving the test signal 28. Preferably, the rail voltages 58, 60 are related to the reference voltages 54, 56. Rail voltage 58 is controlled to be one diode drop above reference voltage 54, while rail voltage 60 is controlled to be one diode drop below reference voltage 56. Such relationship reduces the power dissipation of the driver stage 30.

When the tri-state enable signal 46 is inactive, as for pin driver 23, the pin driver 23 is in normal mode generating a test signal 28 for driving DUT 20 and backdriving preceding circuit 22. Sensor 24 remains active during such time to sense the signal at the DUT 20. When the tri-state enable signal 46 is active, as for pin driver 25, the pin driver 25 is in high impedance mode and the pin driver output is at high impedance enabling response signal 29 to be sensed by sensor 26.

The waveform generator 34 receives the test state signal 50 and slew rate control signal 52 and generates in response a control signal 62 which is input to the predriver stage 32. During normal mode, the predriver stage 32 generates first and second predriver signals 64 and 66. Such predriver signals 64, 66 pull-up or pull-down the test signal 28 through driver stage 30. The predriver stage 32 receives first and second biasing signals 68, 70 from respective biasing circuits 36, 38. The predriver stage 32 also receives first and second current signals 72, 74 for providing the first and second predriver signals 64, 66 with sufficient current to control the power transistors of driver stage 30.

During high impedance mode, the waveform generator 34 still generates control signal 62, although the predriver stage 32 is biased to generate first and second predriver signals 64, 66 which turn off the power transistors of driver stage 30 so as to put the pin driver output at high impedance.

Figure 5:
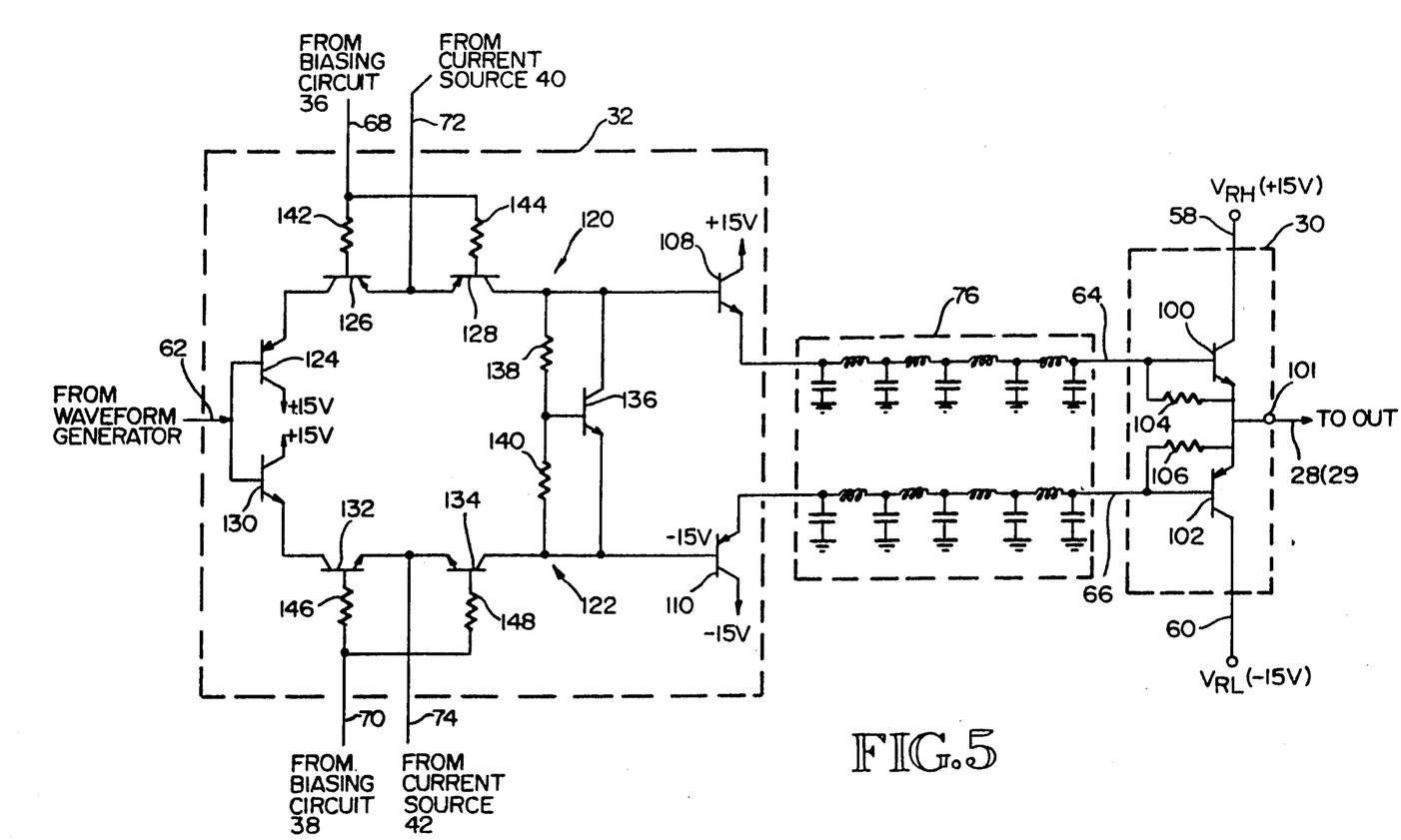
FIG. 5 is a schematic diagram of the predriver stage and driver stage of FIG. 4 according to an embodiment of this invention.

FIG. 5 shows a partial schematic of the pin driver 23 (25), including an embodiment of the driver stage 30 and predriver stage 32. Because the driver stage 30 is located off the IC chip 44 the first and second predriver signals 64, 66 are impacted by the electrical characteristics of the IC package, the pc board, and the electrical connections, including parasitic capacitances and pin inductances. To account for such electrical characteristics, an LC model 76 of the IC 44 is depicted in FIG. 5.

Driver Stage 30

According to one embodiment, the pin driver 23 includes a driver stage 30 which can sink or source approximately 500 milli-Amps (mA) so as to drive DUT 20 and backdrive preceding circuit(s) 22. To accommodate such a large backdriving current the driver stage 30 is formed off the IC 44 with large power transistors 100, 102. FIG. 5 shows the driver stage 30, including power transistors 100, 102 and resistors 104, 106.

The power transistors are cascaded to the predriver output transistors 108, 110. Preferably, the transistors 100, 102 are lightly forward biases for class AB operation. Power transistor 100 is an npn bipolar transistor having a base coupled to the first predriver signal 64, having a collector tied to a high rail voltage $V_{RH}$ and having an emitter coupled to the driver output terminal 101. Resistor 104 is connected across the base and the emitter of transistor 100 for limiting the voltage drop across the base-emitter junction of power transistor 100 during the high impedance mode.

Power transistor 102 is a pnp transistor, having a base coupled to the second predriver signal 66, having a collector tied to a low rail voltage $V_{RL}$ and having an emitter coupled to the driver output terminal 101. Resistor 106 is connected across the base and the emitter of power transistor 102 for limiting the voltage drop across the base-emitter junction of transistor 102 during the high impedance mode. As depicted, the emitters of power transistors 100, 102 are coupled with power transistor 100 for pulling-up the test signal 28 voltage level and the power transistor 102 for pulling-down the test signal 28 voltage level.

The power transistors 100, 102 operate in the active region according to one aspect of the invention rather than switching in and out of saturation according to the conventional practice. By operating in the active region, the storage capacitance of the transistors 100, 102 is reduced enabling faster switching time between logic high and logic low voltage levels. As a result, fast test rates may be applied without the same degree of signal distortion (and less significant transmission line effects). Alternatively, a faster data rate may be applied for the same degree of ringing. According to the preferred embodiment, a fast test rate is applies while the output experiences less signal distortion than for prior art drivers. Thus, the pin driver is more reliable and avoids inadvertent alteration of logic states at preceding circuits.

The rail voltages may be controlled to be one diode drop above or below the corresponding references voltage as previously described. Accordingly, the pin driver can be adapted to drive DUTs of varying logic voltage levels by simply altering the logic high reference voltage, $V_h$, and the logic low reference voltage $V_l$.

For circuits 20, 22 in which 5.0 volts is a logic high and 0.0 volts is a logic low, reference voltages $V_h$ and $V_l$ of 5.0 volts and 0.0 volts may be used. The input reference voltage signals 54, 56, have a relatively small current. The driver stage 30 serves to output a select logic level at a larger current. As previously mentioned, approximately a 500 mA output current is sourced or sunk by the driver stage 30 according to the preferred embodiment.

To achieve a logic high output of 5 volts and a 500 mA current from driver stage 30, the power transistor 100 base is biased with a first predriver signal 64 of 5.7 volts at approximately 20 mA. The power transistor 102 base is biased with a second predriver signal 66 of −0.7 volts turning power transistor 102 off. Given a beta of 0.7 volts between the base and emitter of each power transistor 100, 102, the resulting output level is 5.0 volts.

To achieve a logic low as the driver output, the power transistor 100 base is biased with a first predriver signal 64 of 0.7 volts, while the drive transistor 102 base is biased with a second predriver signal 66 of −5.7 volts at approximately 20 mA. The power transistors 100, 102 are selected to be large enough to source or sink the desired 500 mA of current.

Driver Stage Breakdown Voltage Protection

The ability of the pin driver 23, 25 to put the driver stage output in a high impedance state causes a need for signal paths which can accommodate a large breakdown voltage. During high impedance mode, both power transistors 100, 102 are off as the first and second predriver signals 64, 66 are at 0.0 mA. As a result, each power transistor 100, 102 forms an open circuit from collector to emitter. Thus, the output terminal 101 is at high impedance.

Referring to FIGS. 3-5, pin driver 25 is shown coupled to a DUT output pin. Accordingly, the pin driver 25 is set to high impedance mode. The collector-emitter junction of power transistors 100, 102 are to withstand a voltage difference of twice the maximum voltage swing. Accordingly, the power transistors 100, 102 are selected to have a sufficiently large collector-emitter breakdown voltage rating.

The base-emitter junctions typically have a lower breakdown voltage rating than the collector-emitter junction. The base-emitter junctions are part of respective signal paths from the output terminal 101 to points within the predriver stage 32. The breakdown protection for such signal paths are discussed within the predriver stage breakdown voltage protection description.

Predriver Stage 32

The predriver stage 32 is configured as a unity-gain cascaded complementary emitter follower. First and second predriver signals 64, 66 are generated in response to control signal 62, biasing signals 68, 70 and current signals 72, 74. FIG. 5 shows the predriver stage 32, including a first signal path 120 between the waveform generator 34 and the first predriver signal 64 and a second signal path 122 between the waveform generator 34 and the second predriver signal 66. The first signal path 120 is formed from the predriver stage input from the waveform generator 34, across the base-emitter junction of transistor 124, the collector-emitter junction of transistor 126, the emitter-collector junction of transistor 128 and the base-emitter junction of transistor 108. The second signal path 122 is formed from the predriver stage 32 input from the waveform generator 34, across the base-emitter junction of transistor 130, the collector-emitter junction of transistor 132, the emitter-collector junction of transistor 134 and the base-emitter junction of transistor 110.

For a control signal 62 which generates a logic high in the test signal 28, the signal current through transistor 124 is reduced, diverting current from source 40 to drive through transistor 128 and transistor 108 into power transistor 100. In addition, the current through transistor 130 increases, sourcing much of the current into source 42 so as to reduce the current to transistor 110 and power transistor 102.

For a control signal 62 which generates a logic low in the test signal 28, the signal current through transistor 130 is reduced, diverting current from source 42 to drive through transistor 134 and transistor 110 into power transistor 102. In addition the current through transistor 124 increases, sinking much of the current from source 40 so as to reduce the current to transistor 108 and power transistor 100.

The predriver stage 32 also includes a biasing network of transistor 136 and resistors 138, 140 connected across the first and second signal paths 120, 122. The network forward biases the predriver stage to approximately 3 $V_{BE}$ for class AB operation. Such biasing maintains a low quiescent current for test signal 28 and reduces cross-over harmonic distortions.

The base currents into the respective transistors 108, 110 determine the conductivity of such transistors 108, 110, and thus, determine the current of the respective first predriver signal 64 and second predriver signal 66. Accordingly, the quiescent current through the power transistors 100, 102 are reduced. The amount of base current into transistor 108 is determined by the current of current signal 72 input from the current source 40. The current signal 72 is defined so as to generate a first predriver signal 64 sufficient to bias power transistor 100 to generate an appropriate logic high output. According to the preferred embodiment, current signal 72 is 21 mA, which results in approximately 11 mA into the base of transistor 108 when the test state signal 50 selects logic high as the voltage level for the test signal 28. The 11 mA base current biases the transistor 108 so as to generate approximately a 20 mA current into the base of power transistor 100 causing a logic high output from driver stage 30.

Similarly, the amount of base current into transistor 110 is determined by the current of current signal 74 input from the current source 42. The current signal 74 is defined so as to generate a second predriver signal 66 sufficient to bias power transistor 102 to generate an appropriate logic low output. According to the preferred embodiment, current signal 74 is −21 mA causing approximately −11 mA into the base of transistor 110 when test state signal 50 selects logic low as the voltage level for the test signal 28. The −11 mA base current biases the transistor 110 so as to generate approximately a −20 mA current into the base of power transistor 102.

As previously mentioned, the transistors 126, 128 in the first signal path 120 and transistors 132, 134 in the second signal path 122 function as transmission gates during normal mode. During normal mode, the tri-state enable signal 46 is inactive allowing biasing circuits 36, 38 to apply respective −15 volts and +15 volts to the predriver stage 32. Biasing circuit 36 generates a −15 volt signal 68 received across resistors 142, 144 turning on transistors 126, 128. Similarly, biasing circuit 38 generates a +15 volt signal 70 received across resistors 146, 148 turning on transistors 132, 134. The transistors 126, 128 and 132, 134 are biased during normal mode with the base resistors 142, 144, 146, 148, respectively, determining the degree of conductance. For an output rail voltage swing of +15 volts to −15 volts, and base resistors 142, 144, 146, 148 of 5 kilohms each, the base current for driving the respective transistors 126, 128, is 5.4 mA (and for transistors 132, 134 is −5.4 mA). As a result, a worst case of 11 mA flows to transistor 108 (110). To maintain adequate switching speed and adequate base drive, the current source 40 provides a constant current signal 72 during normal mode of 21 mA, while the current source 42 supplies a constant current signal 74 of −21 mA.

Predriver Stage Breakdown Voltage Protection

As previously mentioned, the ability of the pin driver 23, 25 to put the driver stage 30 output in a high impedance state causes a need for signal paths which can accommodate a large breakdown voltage. When the pin driver 23, 25 is in high impedance mode, the tri-state enable line is active. The waveform generator 34, however, still can output a control signal 62. In addition, the DUT 20 or a preceding circuit 22 may generate a voltage potential at the output terminal 101. For a waveform generator control signal 62 of −12 volts and a voltage potential at terminal 101 of approximately +12 volts, the voltage difference of 24 volts occurs across predriver stage 32 and driver stage 30. The voltage levels at the currents sources 40, 42 may be as high as +/−14 volts. Accordingly, the voltage differential may be 26 volts.

The first predriver signal path 120 includes the base-emitter junctions of transistor 124 and 108. Extending the path 120 to the driver output 101 further includes the base-emitter junction of the power transistor 100. Because the breakdown voltage of a base-emitter junction is approximately 7.7 volts, protection transistors 126 and 128 are included in signal path 120. The collector-emitter junctions of such transistors form part of the signal path 120. The breakdown voltage for a collector-emitter junction is approximately 33 volts. Unlike, the base-emitter junction, however, the collector-emitter junction has a high breakdown voltage only in the one direction. Thus, two transistors 126, 128 are used in the predriver signal path 120, each providing a high breakdown voltage in a distinct direction. The two transistors 126, 128 are oriented so that the collector-emitter junction of one transistor 126 provides forward breakdown voltage protection, while the collector-emitter junction of the other transistor 128 provides reverse breakdown voltage protection.

Similarly, the second predriver signal path 122 includes the base-emitter junctions of transistor 130 and 110. Extending the path 122 to the driver output 101 adds the base-emitter junction of the power transistor 102. Because the breakdown voltage of a base-emitter junction is approximately 7.7 volts, protection transistors 132 and 134 are included in signal path 122. The collector-emitter junctions of such transistors form part of the signal path 122. The two transistors 132, 134 are oriented so that the collector-emitter junction of one transmitter 132 provides forward breakdown voltage protection, while the collector-emitter junction of the other transistor 134 provides reverse breakdown voltage protection.

Transistors 126, 128 are configured "back-to-back" as transmission gates, coupling the current source 40 to emitter followers 124 and 108. Transistors 132, 134 also are configured "back-to-back" as transmission gates, coupling the current source 42 to emitter followers 130 and 110. By connecting two current switch transistors "back-to-back" as shown in FIG. 5, one of the pair is able to sustain high reverse voltage breakdown, while the other is able to sustain high forward voltage breakdown.

To achieve breakdown voltage protection during high impedance mode, the transistors 126, 128 are turned off by biasing signal 68 in response to the tri-state enable signal 46 received at biasing circuit 36. Similarly, transistors 132, 134 are turned off by biasing signal 70 in response to the tri-state enable signal 46 received at biasing circuit 38. Biasing signal 68 normally is −15 volts. To turn off transistors 126, 128 the biasing signal 68 is switched to +15 volts in response to the tri-state enable signal 46. Biasing signal 70 normally is +15 volts. To turn off transistors 132, 134 the biasing signal 70 is switched to −15 volts in response to the tri-state enable signal 46. The large voltage swing for switching the transmission gates ensures a low "on" resistance, and maintains unity gain for the predriver stage output signals 64, 66. Because pin drivers normally switch between normal mode and high impedance mode at a relatively slower speed, the resulting slower switching time when switching to high impedance mode is tolerable.

Waveform Generator 34

Figure 6:
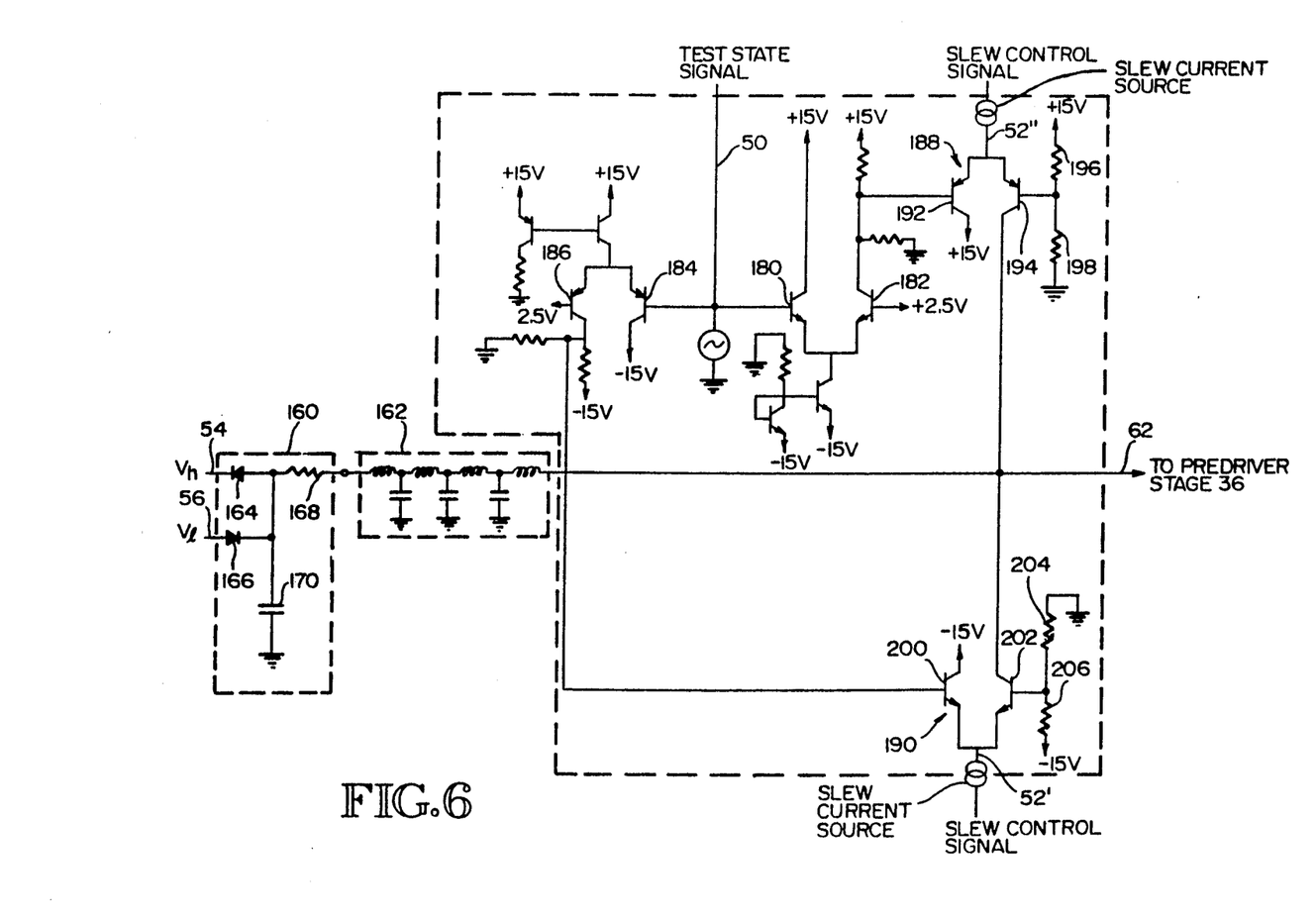
FIG. 6 is a schematic diagram of the waveform generator of FIG. 4 according to an embodiment of this invention.

FIG. 6 shows a schematic of a preferred embodiment of the waveform generator 34 formed on IC 44, along with off-chip circuitry 160 and an LC model 162. The function of the waveform generator 34 is to generate a control signal 62 for the predriver stage 32. The waveform generator 34 receives a test state signal 50 which determines whether the high reference voltage $V_h$ or the low reference voltage $V_l$ defines the control signal 62 voltage signal. The slew control signal 52 determines the slew rate of the pin driver 23, 25 for switching between logic states.

The signal paths 54, 56 carry the high and low voltage references input to clamping diodes 164, 166. The diodes 164, 166 are formed off the IC chip 44 so that diodes with large reverse breakdown voltage levels may be used. According to the preferred embodiment, the diodes 164, 166 are high conductance, fast switching diodes having a breakdown voltage of more than 75 volts at 5 micro-Amps.

To correctly define the voltage levels and reduce ringing in the output signal 62 of the waveform generator, an LC model 162 is shown for depicting the parasitic capacitances and inductances of the IC package. The off chip circuitry 160 also includes a resistor 168 for damping any ringing caused by the LC model 162. A parasitic capacitance 170 also is represented.

Referring to the waveform generator 34, the test state signal 50 controls two level translators formed by two pairs of emitter coupled transistors 180, 182 and 184, 186. When the test state signal 50 switches to a logic high, the first level translator formed by transistor 184, 186 switches the base of transistor 200 above the switching threshold of current switch 190 defined by resistor 204 and 206. Transistor 202 switches off the slew current source 52' from discharging the output signal 62. The second translator formed by transistors 180, 182 switches the base of transistor 192 above the switching threshold of the current switch 188 defined by the resistors 196 and 198. Transistor 194 of the current switch 188 switches on the slew current source signal 52" to charge the output signal 62 of the waveform generator. The current source signal 52" is determined by the slew rate control signal 52. The output of the waveform generator 34 rises until it is clamped to one diode drop above $V_h$. The larger the slew control signal, the faster the predriver stage 32 charges and thus the faster the turn-on slew rate. According to the preferred embodiment, the slew rate control signal is an analog signal which varies between 0 and 5 volts. By using an analog signal, the control over the slew rate is continuous instead of incremental.

When the test state signal 50 switches to a logic low, the second level translator formed by transistors 180, 182 switches the base of transistor 192 below the switching threshold of the current switch 188. Transistor 194 turns off, preventing the slew current source signal 52" from charging the output of the waveform generator 34. The first level translator formed by transistors 184, 186 switches the base of transistor 200 below the switching threshold of the current switch 190. Transistor 202 of the current switch 190 switches the slew current source signal 52' to discharge the output signal 62 of the waveform generator. The current source signal 52' is determined by the slew rate control signal 22. The output of the waveform generator 34 discharges until it is clamped at one diode drop below $V_l$. The larger the slew control signal, the faster the predriver stage 32 discharges and thus the faster the turn off slew rate.

Biasing Circuits 36, 38 and Current Sources 40, 42

Biasing circuits 36, 38 are conventional circuits which respond to the tri-state enable signal 46 to generate either a +15 volt or −15 volt biasing signal 68, 70. As previously described, biasing circuit 36 generates a +15 volt signal 68 when tri-state signal 46 is active and a −15 volt signal 68 when tri-state signal 46 is inactive. Analogously, biasing circuit 38 generates a −15 volt signal 70 when tri-state enable signal 46 is active, and a +15 volt signal 70 when tri-state enable signal 46 is inactive.

Current sources 40, 42 are also conventional circuits. According to the preferred embodiment the current sources, 40, 42 are "Wilson" current sources having a current mirror ratio of 9:1 and providing a constant current of 21 mA (−21 mA).

Conclusion

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A tri-state pin driver for generating at an output node either one of a test signal or a tri-state condition, said test signal having either one of a logic high or a logic low voltage level, said test signal driving a device under test and backdriving another circuit to which the device under test is coupled, the pin driver having a driver stage and a pre-driver stage;
the driver stage comprising a first and a second power transistor, respective emitter terminals of said power transistors coupled to form said output node;
the pre-driver stage comprising a first and a second pre-driver transistor, said first power transistor coupled to said first pre-driver transistor in an emitter follower configuration, said second power transistor coupled to said second pre-driver transistor in an emitter follower configuration, said pre-driver stage receiving a current signal and a biasing signal, said biasing signal having an active state and an inactive state, during said active state said biasing signal turning off said first and second pre-driver transistors to put said first and second power transistors at high impedance and generate said tri-state condition, during said inactive state said current signal controlling a base current of said first and second pre-driver transistors for driving said first and second power transistors within respective active regions to generate either one of said test signal logic high or logic low voltage levels at a current driving the device under test and backdriving said another device.

2. The pin driver of claim 1 in which said pre-driver stage further comprises:
a first pair of transistors coupled to said first pre-driver transistor and a second pair of transistors coupled to said second pre-driver transistor, during said bias signal inactive state said first and second pair of transistors serving as a transmission gate while said first and second pre-driver transistors receive the current signal and drive the power transistors to output either one of said logic high or logic low voltage levels, during said biasing signal state said first and second pair of transistors receiving said biasing signal and turning the first and second pre-driver transistors off to put the first and second power transistors at high impedance for the tri-state condition.

3. The pin driver of claim 2 in which while the first and second power transistors are at high impedance one transistor of said first pair of transistors is configured to provide forward breakdown voltage protection, and the other of said first pair of transistors is configured to provide reverse breakdown voltage protection.

4. The pin driver of claim 1 in which the test signal voltage levels for a logic high and a logic low are approximately defined by a high reference voltage and a low reference voltage, respectively; and in which a different test signal logic high voltage level is generated by substituting a different high reference voltage, and a different test signal logic low voltage level is generated by substituting a different low reference voltage, said substituting enabling the pin driver to be used for generating test signals compatible with alternative devices under test which register alternative voltage levels as a logic high voltage level and alternative voltage levels as a logic low voltage level.

5. The pin driver of claim 2 formed as an integrated circuit with said driver stage formed off-chip enabling said power transistors to be large enough to sink or source approximately 500 milli-Amp of test signal current.

6. A tri-state pin driver for generating a test signal for driving a device under test and backdriving another circuit to which the device under test is coupled, the pin driver comprising a driver stage, a predriver stage and a waveform generator;
the driver steps comprising: a first and a second power transistor, mutual terminals of said power transistors coupled to form an output at which the test signal is generated, said power transistors operated in the active region for generating each of high and low logic levels of said test signal;

the predriver stage comprising: a first signal path coupled to the base of said first power transistor and a second signal path coupled to the base of said second power transistor, each one signal path of said first and second signal paths comprising a pair of transistors which open circuit said one signal path while said pin driver output is at a high impedance and which form a transmission gate while said pin driver output drives said test signal;

said open circuit formed across the respective collector-emitter junctions of said signal path transistors, one transistor of said pair of signal path transistors configured to provide forward breakdown voltage protection, the other of said pair of signal path transistors configured to provide reverse breakdown voltage protection.

7. The pin driver of claim 6 in which said waveform generator receives a test state signal for defining the logic state of said test signal and which receives a slew control signal for defining a slew rate of said test signal, said waveform generator generating a control signal input to said predriver stage, said control signal having a voltage level for defining a pull-up or pull-down of said test signal in accordance with the defined test signal logic state, and having a current for determining a speed of said pull-up or pull-down in accordance with the defined test signal slew rate.

8. The pin driver of claim 7 formed as an integrated circuit with said driver stage formed off-chip for sinking or sourcing backdriving currents.

9. The pin driver of claim 8 further comprising a first and second diode coupled to said integrated circuit at said waveform generator, said high reference voltage applied across said first diode, said low reference voltage applied across said second diode, said test state signal determining whether said control signal is at approximately said high reference voltage plus one diode drop or at approximately said low reference voltage less one diode drop, said first and second diode each having a reverse breakdown voltage of more than 30 volts.

10. The pin driver of claim 6 in which the predriver stage is forward biased for class AB operation for maintaining a low quiescent current of the test signal.

11. A tri-state pin driver for generating at an output node either one of a test signal or a tri-state condition, said test signal having either one of a logic high or a logic low voltage level, said test signal driving a device under test and backdriving another circuit to which the device under test is coupled, the pin driver having a driver stage and a pre-driver stage:

the driver stage comprising a first and a second power transistor, each said power transistor having a base terminal, collector terminal and emitter terminal, respective emitter terminals of said power transistors coupled to form said output node, the pre-driver stage comprising a first and a second pre-driver transistor, said first power transistor base terminal coupled to said first pre-driver transistor in an emitter follower configuration, said second power transistor base terminal coupled to said second pre-driver transistor in an emitter follower condition, said pre-driver stage further comprising a first pair of transistors coupled to said first pre-driver transistor and a second pair of transistors coupled to said second pre-driver transistor, said first and second pair of transistors serving as respective transmission gates while said first and second pre-driver transistors drive the power transistors to generate said logic high and logic low test signal levels, said first and second pair of transistors being biased to turn the first and second pre-driver transistors off putting the first and second power transistors at high impedance for the tri-state condition.

12. A tri-state pin driver for generating at an output node either one of a test signal or a tri-state condition, said test signal having a logic high or a logic low voltage level, said test signal driving a device under test and backdriving another circuit to which the device under test is coupled, the pin driver having a driver stage and a pre-driver stage:

the driver stage comprising a first and a second power transistor, each said power transistor having a base terminal, collector terminal and emitter terminal, respective emitter terminals coupled to form said output node, said first power transistor collector terminal receiving a first rail voltage signal, said second power transistor collector terminal receiving a second rail voltage signal;

the pre-driver stage comprising a first and a second pre-driver transistor, said base terminal of said first power transistor coupled to said first pre-driver transistor in an emitter follower configuration, said base terminal of said second power transistor coupled to said second pre-driver transistor in an emitter follower configuration;

wherein for said tri-state condition said first and second pre-driver transistors are turned off and wherein for said test signal said first and second pre-driver transistors drive said first and second power transistors, respectively, within active regions to generate said test signal from said first and second rail voltage signals, said test signal having a current driving the device under test and backdriving said another circuit; and wherein said pin driver is formed as an integrated circuit having said first and second power transistors formed off-chip.

13. The pin driver of claim 12 in which said pre-driver stage further comprises: a first pair of transistors coupled to said first pre-driver transistor and a second pair of transistors coupled to said second pre-driver transistor, said first and second pair of transistors serving as respective transmission gates while said first and second pre-driver transistors drive the power transistors to generate said logic high and logic low test signal levels, said first and second pair of transistors being biased to turn the first and second pre-driver transistors off putting the first and second power transistors at high impedance for the tri-state condition.

14. The pin driver of claim 13 in which while the first and second power transistors are at high impedance one transistor of said first pair of transistors is configured to provide forward breakdown voltage protection, and the other of said first pair of transistors is configured to provide reverse breakdown voltage protection.

15. The pin driver of claim 12 in which said pre-driver stage receives a current signal and a biasing signal, said biasing signal turning off said first and second pre-driver transistors to put said first and second power transistors at high impedance to generate a tri-state output condition, said current signal controlling a base current of said first and second pre-driver transistors for driving said first and second power transistors to generate said test signal high or low logic levels.

* * * * *